(12) United States Patent
Lin

(10) Patent No.: US 10,149,398 B2
(45) Date of Patent: Dec. 4, 2018

(54) METHOD FOR IMPROVING FIRE PREVENTION PERFORMANCE OF VEHICLE-CARRIED DATA RECORDING DEVICE AND PROTECTION DEVICE THEREOF

(71) Applicant: DUVONN ELECTRONIC TECHNOLOGY CO., LTD, Jiangsu (CN)

(72) Inventor: Wancai Lin, Jiangsu (CN)

(73) Assignee: DUVONN ELECTRONIC TECHNOLOGY CO., LTD, Jiangsu (CN)

( * ) Notice: Subject to any disclaimer, the term of this patent is extended or adjusted under 35 U.S.C. 154(b) by 347 days.

(21) Appl. No.: 14/436,440

(22) PCT Filed: Dec. 12, 2013

(86) PCT No.: PCT/CN2013/089229
§ 371 (c)(1),
(2) Date: Jul. 24, 2015

(87) PCT Pub. No.: WO2014/114149
PCT Pub. Date: Jul. 31, 2014

(65) Prior Publication Data
US 2015/0257298 A1    Sep. 10, 2015

(30) Foreign Application Priority Data

Jan. 24, 2013  (CN) .......................... 2013 1 0026269

(51) Int. Cl.
*B65D 90/32*      (2006.01)
*H05K 5/06*       (2006.01)
(Continued)

(52) U.S. Cl.
CPC .............. *H05K 5/069* (2013.01); *G07C 7/00* (2013.01); *H05K 5/0004* (2013.01);
(Continued)

(58) Field of Classification Search
CPC .... B65D 90/325; B65D 90/32; B65D 25/385; B60K 2015/03381; H05K 5/069
(Continued)

(56) References Cited

U.S. PATENT DOCUMENTS 4,769,261 A  *  9/1988  Hazelton ................. B32B 25/08
                                                    428/35.3
5,285,559 A  *  2/1994  Thompson ........... H05K 5/0213
                                                    174/16.3
(Continued)

FOREIGN PATENT DOCUMENTS

CN       201616123 U     10/2010
CN       101953239 A      1/2011
(Continued)

*Primary Examiner* — King M Chu
(74) *Attorney, Agent, or Firm* — Seed IP Law Group LLP

(57) ABSTRACT

A method for improving fire prevention performance of a vehicle-carried data recording device and a protection device thereof are provided, where the method includes: mounting the vehicle-carried data recording device in a water-proof shell in a sealing manner; mounting the water-proof shell in a mounting space enclosed by an upper constant-temperature water shell and a lower constant-temperature water shell; injecting a liquid into the upper constant-temperature water shell and the lower constant-temperature water shell; mounting a constant-temperature water shell composed of the upper constant-temperature water shell and the lower constant-temperature water shell in a fire-proof box; and packing the fire-proof box in a protective housing with heat dissipation holes to prevent a data recording device from being damaged when the vehicle is damaged by the action of an external force. The device is majorly (Continued)

encased by a water-proof shell, a constant-temperature water shell, a fire-proof box and a protective housing successively. The present disclosure has advantages of long fire resistance time and high data security.

13 Claims, 15 Drawing Sheets

(51) Int. Cl.
    *H05K 5/02*     (2006.01)
    *G07C 7/00*     (2006.01)
    *H05K 5/00*     (2006.01)
    *H05K 5/03*     (2006.01)

(52) U.S. Cl.
    CPC ......... *H05K 5/0213* (2013.01); *H05K 5/0217* (2013.01); *H05K 5/03* (2013.01); *Y10T 29/4998* (2015.01)

(58) Field of Classification Search
    USPC .................................. 206/811, 521; 220/88.1
    See application file for complete search history.

(56) References Cited

U.S. PATENT DOCUMENTS

| | | |
|---|---|---|
| 5,756,934 A | 5/1998 | Purdom |
| 2006/0272838 A1 | 12/2006 | Sauerzweig |
| 2009/0050365 A1 | 2/2009 | Moore et al. |
| 2012/0225227 A1* | 9/2012 | Radosta ............... B65D 81/343 |
| | | 428/35.2 |

FOREIGN PATENT DOCUMENTS

| | | |
|---|---|---|
| CN | 202257712 U | 5/2012 |
| CN | 103118509 A | 5/2013 |
| JP | 2007-164775 A | 6/2007 |
| JP | 2010-42804 A | 2/2010 |
| JP | 2011-523505 A | 8/2011 |
| WO | 2005/104707 A2 | 11/2005 |
| WO | 2006/058044 A2 | 6/2006 |
| WO | 2007-079371 A2 | 7/2007 |
| WO | 2009/137072 A1 | 11/2009 |

* cited by examiner

METHOD FOR IMPROVING FIRE PREVENTION PERFORMANCE OF VEHICLE-CARRIED DATA RECORDING DEVICE AND PROTECTION DEVICE THEREOF

BACKGROUND

Technical Field

The present disclosure relates to a vehicle-carried data recording device, and particularly to a vehicle-carried data record protection device that can still ensure that data will not be damaged in case of fire lasting more than 30 minutes, a method for improving fire prevention performance of a vehicle-carried data recording device and a protection device thereof.

Description of the Related Art

At present, the constant increase of consumers' requirements for vehicle safety and vehicle intelligence and automation will also promote rapid spread of vehicle traveling data recorders. Promotion of the vehicle traveling data recorders for traffic safety and functions thereof on traffic management and post-analysis of accidents have been generally recognized by traffic management personnel at all levels, automobile research and development, and production enterprises in our country. Therefore, in recent years, the ministry of public security has made greater efforts to promote applications of the vehicle traveling data recorders to traffic management. These indicate a broad market for the applications of the vehicle traveling data recorders.

A vehicle traveling data recorder is mounted into a cab of a vehicle and may curb bad driving behaviors such as fatigue driving and overspeed to prevent occurrence of traffic accidents. Once a traffic accident happens to the vehicle, relevant data can be taken out by using a storage module in the vehicle traveling data recorder. The vehicle traveling data recorder can display driving data of 20 seconds prior to occurrence of the accident, including the driver's braking condition, whistling, left and right lights, braking distance, braking time, or the like, provides reliable original data for accident analysis and identification, and also can store audio, video and photographed image data in the vehicle and the working condition of the engine as well as running information of vehicle-carried electronic components.

Stored data is the most direct and the most powerful evidence source for analyzing a cause of an accident. Then, in the current existing technological field, a data storage module circuit can be taken out only in a case where it is not damaged. When spontaneous combustion or fuel combustion and even burnout is caused after a vehicle accident, the storage module circuit in the vehicle traveling data recorder is also burned accordingly and relevant data information of the scene cannot be taken out, which affects law enforcement officers' analysis and judgment on the traffic accident and makes it impossible to determine the cause of the accident rapidly or to provide vehicle data prior to occurrence of the accident to the automobile research and development, production enterprises for improvement.

Existing vehicle-carried data recorder protection devices are mostly made of heat-insulating materials to prevent high temperatures from damaging data recording devices in case of fire. However, after fire occurs, heat conducted to the data recording device cannot be dissipated, resulting in rapid increase in the temperature thereof, thereby causing damage to the data recording device. As far as the applicant knows, the fire resistance time of such data recorders on which only heat insulating measures are taken to prevent fire does not exceed 10 minutes currently, while the general combustion time of vehicle fire is between 20-40 minutes. That is to say, before the vehicle fire is put out, vehicle-carried data has been damaged, and relevant vehicle information cannot be obtained therefrom. As far as the applicant knows, fire is one of main causes why a vehicle-carried data recording device cannot provide recorded data when a vehicle accident occurs. Therefore, it is imperative to design a vehicle-carried data recorder protection device that can resist high temperatures and can bear high-temperature burning of vehicle fire without damage so as to provide first-hand data in case of an accident.

BRIEF SUMMARY

Technical Problem

An objective of the present disclosure is, with respect to the problem that existing vehicle-carried record protection devices have poor capability to resist fire damage, to invent a fire prevention method with the fire resistance time at least greater than an average vehicle burnout time and design a corresponding vehicle-carried data record protection device.

Technical Solution

A first technical solution of the present disclosure is as follows:

A method for improving fire prevention performance of a vehicle-carried data recording device, including:

mounting the vehicle-carried data recording device in a water-proof shell in a sealing manner;

mounting the water-proof shell in a mounting space enclosed by an upper constant-temperature water shell and a lower constant-temperature water shell;

injecting a liquid with a boiling point of 90°-140° C., heat of vaporization of greater than 2000 kJ/kg and specific heat capacity of greater than 3.5 kJ/kg° C. into the upper constant-temperature water shell and the lower constant-temperature water shell; taking away heat by using thermal evaporation of the liquid, to cause time during which an ambient temperature of the water-proof shell in the mounting space is lower than a highest temperature (for example, 150° C.) that can be borne by the vehicle-carried data recording device to be not less than 40 minutes, so that the vehicle-carried data recording device will not be damaged due to high temperatures during combustion of a vehicle in case of fire;

mounting a constant-temperature water shell composed of the upper constant-temperature water shell and the lower constant-temperature water shell in a fire-proof box, to prevent flame from directly burning the constant-temperature water shell in case of fire, and in order to ensure heat dissipation of a circuit with large power consumption during normal operation, providing a heat dissipation port, capable of closing automatically in case of fire, for outward heat dissipation of the constant-temperature water shell on one or more surfaces of the fire-proof box; and packing the fire-proof box in a protective housing with heat dissipation holes to prevent the data recording device from being damaged when the vehicle is damaged by the action of an external force and to improve impact resistance of the data recording device, positions of the heat dissipation holes being opposite the heat dissipation port on the fire-proof box.

The liquid is preferably water or an anti-freezing solution with water as a main component.

The fire-proof box consists of a box body and a box cover, one or more surfaces in five surfaces composing the box body are movable blocks, the heat dissipation port is formed between the movable block and a base of the box body, the movable block is lifted in the protective housing through a hot-melt plastic screw, when fire happens, the hot-melt plastic screw is quickly burned out, the movable block automatically falls down under the action of a spring to close off the heat dissipation port, so as to prevent external heat from directly entering the constant-temperature water shell, and in order to prevent separation of the movable block from the box bottom, a retaining pin hole is provided on the movable block, a matching retaining pin is mounted on the constant-temperature water shell, and after the retaining pin is inserted into the retaining hole, the movable block is locked and positioned.

The upper constant-temperature water shell and the lower constant-temperature water shell are filled with liquid-absorbing material balls, and liquids in the upper constant-temperature water shell and the lower constant-temperature water shell are adsorbed in the liquid-absorbing material balls, so as to ensure that a liquid available for evaporation to maintain a constant temperature still exists in a case where the upper constant-temperature water shell and the lower constant-temperature water shell have cracks or damage.

A second technical solution of the present disclosure is as follows:

A vehicle-carried data record protection device with high fire prevention performance and impact resistance, including:

a water-proof shell 2, where the water-proof shell 2 is configured to mount a vehicle-carried data recording device 1, to prevent the vehicle-carried data recording device 1 from being damaged due to entering of a liquid, and in order to reduce vibration during running of the vehicle and prevent influences of impact generated when the vehicle is damaged on the vehicle-carried data recording device 1, a shock pad 3 is mounted outside the water-proof shell 2;

a constant-temperature water shell 4, where the water-proof shell 2 is mounted in the constant-temperature water shell 4, and a liquid with a boiling point of 90°-140° C., heat of vaporization of greater than 2000 kJ/kg and specific heat capacity of greater than 3.5 kJ/kg° C. is injected into the constant-temperature water shell 4; where the constant-temperature water shell 4 is further provided with an air outlet 46 for escape of gas generated during evaporation of the liquid;

a fire-proof box 5, where the fire-proof box 5 is configured to pack the constant-temperature water shell 4 to prevent flame from directly burning the constant-temperature water shell 4; where the fire-proof box 5 consists of a box body 51 and a box cover 52, one or more of five surfaces composing the box body 51 are movable blocks 54, a heat dissipation port for heat dissipation of the constant-temperature water shell 4 is formed between the movable block 54 and a bottom surface of the box body 51, and the movable block 54 may automatically block the heat dissipation port in case of fire; and a protective housing 6, where the protective housing 6 is configured to mount the fire-proof box 5 and be fixedly connected to the vehicle and has a capability of resisting impact and transformation, heat dissipation holes 62 being provided at positions corresponding to that of the heat dissipation port.

The constant-temperature water shell 4 is composed of an upper constant-temperature water shell 41 and a lower constant-temperature water shell 42 and is located in a space enclosed by the upper constant-temperature water shell 41 and the lower constant-temperature water shell 42; the constant-temperature water shell 4 is filled with liquid-absorbing material balls 44 that prevent the liquid from flowing out of the air outlet; and a retaining pin 43 for locking the fire-proof movable block 54 is mounted on the upper constant-temperature water shell 41 or the lower constant-temperature water shell 42.

A liquid-sealing paste 45 is pasted on the air outlet 46 and the liquid-sealing paste can automatically open under impact of steam generated by the liquid in the constant-temperature water shell.

The movable block 54 in the fire-proof box 5 is lifted in the protective housing 6 through a hot-melt plastic screw 61, a preventing anti-reset spring 56 and a retaining pin hole 55 for locking are further provided on the movable block 54, and the retaining pin hole 55 matches the retaining pin 43 mounted on the constant-temperature water shell 4.

A lower end of the movable block 54 is a wedge-like structure composed of two slopes and a matching recess structure is provided on the box body 51 at a position opposite the wedge-like structure.

Advantageous Effect

The present disclosure has the following beneficial effects:

The present disclosure fills a loophole on road traffic safety management, makes up for great defects on the function of the vehicle traveling data recorder, and further provides a supplementary part for National Standard GB/T 19056-2012 of Vehicle Traveling Data Recorder.

The present disclosure can effectively protect a data storage module after spontaneous combustion and even burnout of a vehicle in case of an accident, and provide scientific, loyal, authoritative original storage data for accident definition, analysis, and processing by the law enforcement officers in a case where the scene is burned out and there is no evidence. The present disclosure can provide evidence for investigators, help them to understand the truth of the accident to quickly determine the cause of the accident, and effectively prevent occurrence of road traffic accidents.

The present disclosure will fill unprecedented void on the function of the vehicle traveling data recorder on the whole vehicle market and can ensure that the data module circuit is intact no matter how severe the scene of the accident is, so as to smoothly take out data information. Therefore, it becomes a witness to the accident and also becomes "a warning for those behind", thereby avoiding occurrence of the same accident and taking better security measures.

By experiments, when the present disclosure uses water as a constant-temperature liquid, the vehicle-carried data recorder can be guaranteed to bear high-temperature burning without damage for more than 1 hour, and audio and video data can still be completely taken out therefrom.

The present disclosure not only can prevent fire but also has good impact resistance and waterproof functions. The shell of the protection device is still intact after mere impact at a speed of 100 km/h and no water will enter the protection device in a depth of 10.

In the figures: 1 denotes a vehicle-carried data recording device, 11 denotes a connecting cable of the vehicle-carried data recording device, 2 denotes a water-proof shell, 3 denotes a shock pad, 4 denotes a constant-temperature water shell, 41 denotes a constant-temperature upper box, 42 denotes a lower constant-temperature water shell, 43 denotes a fire-proof heat-insulating movable block retaining pin, 44 denotes liquid-absorbing material balls, 45 denotes a liquid-sealing paste, 46 denotes an air outlet, 5 denotes a fire-proof box, 51 denotes a fire-proof box body, 52 denotes a first fire-proof box cover, 53 denotes a second fire-proof box cover, 54 denotes left and right fire-proof heat-insulating movable blocks, 55 denotes fire-proof heat-insulating movable block retaining pin holes, 56 denotes left and right compression springs, 6 denotes a protective housing (made of steel), 61 denotes hot-melt plastic screws, 62 denotes convection heat dissipation holes, and 63 denotes a device fixing hole.

DETAILED DESCRIPTION

The present disclosure is further described below with reference to the accompanying drawings and embodiments.

Embodiment 1

Refer to FIG. 1 to FIG. 15.

Figure 3:
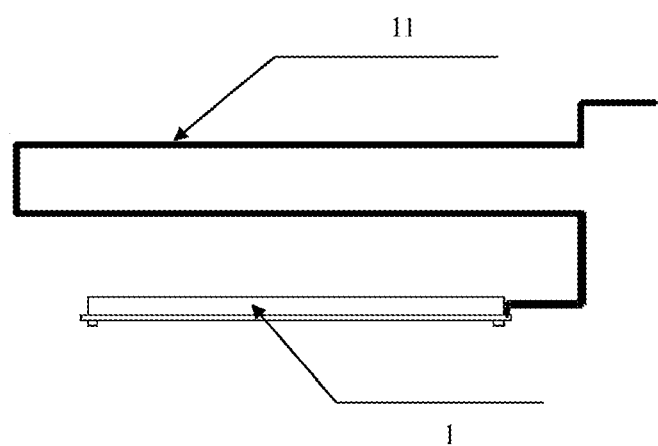
FIG. 3 is a schematic view of a vehicle-carried data recording device and routing of a cable of the present disclosure.
Figure 4:
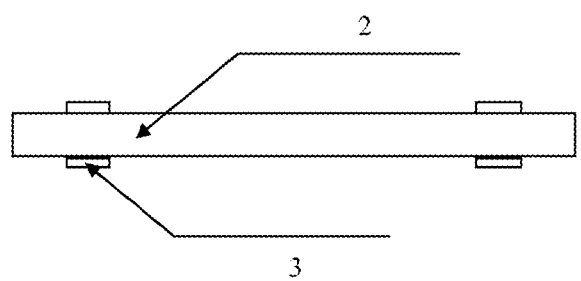
FIG. 4 is a schematic structural view of a water-proof shell of the present disclosure.

A method for improving fire prevention performance of a vehicle-carried data recording device includes the following steps:

Firstly, a vehicle-carried data recording device 1 shown in FIG. 3 is mounted in a water-proof shell 2 shown in FIG. 4 in a sealing manner and a shock pad 3 is further mounted on the water-proof shell 2 so as to improve anti-shock performance and impact resistance.

Figure 5:
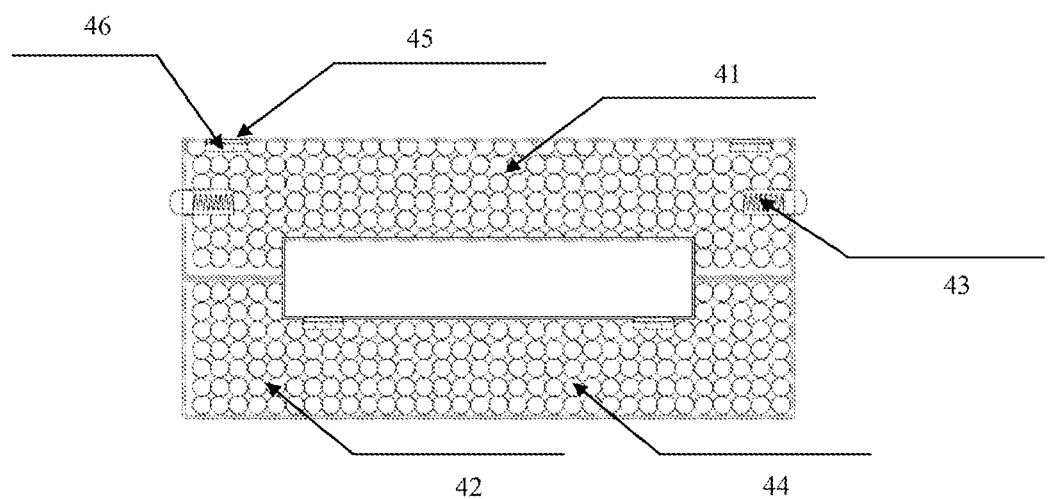
FIG. 5 is a sectional view of an internal structure of a constant-temperature water shell of the present disclosure.
Figure 6:
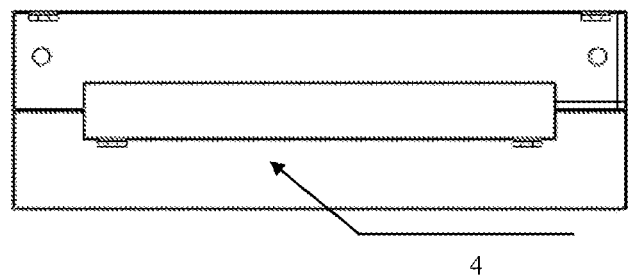
FIG. 6 is a schematic view of an outline structure of a constant-temperature water shell of the present disclosure.

Secondly, the water-proof shell 2 is mounted in a mounting space enclosed by an upper constant-temperature water shell 41 and a lower constant-temperature water shell 42 as shown in FIG. 5 and FIG. 6.

Figure 7:
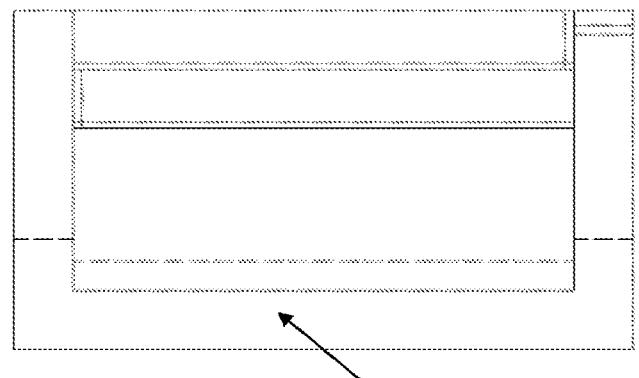
FIG. 7 is a schematic structural view of a fire-proof box of the present disclosure.
Figure 8:
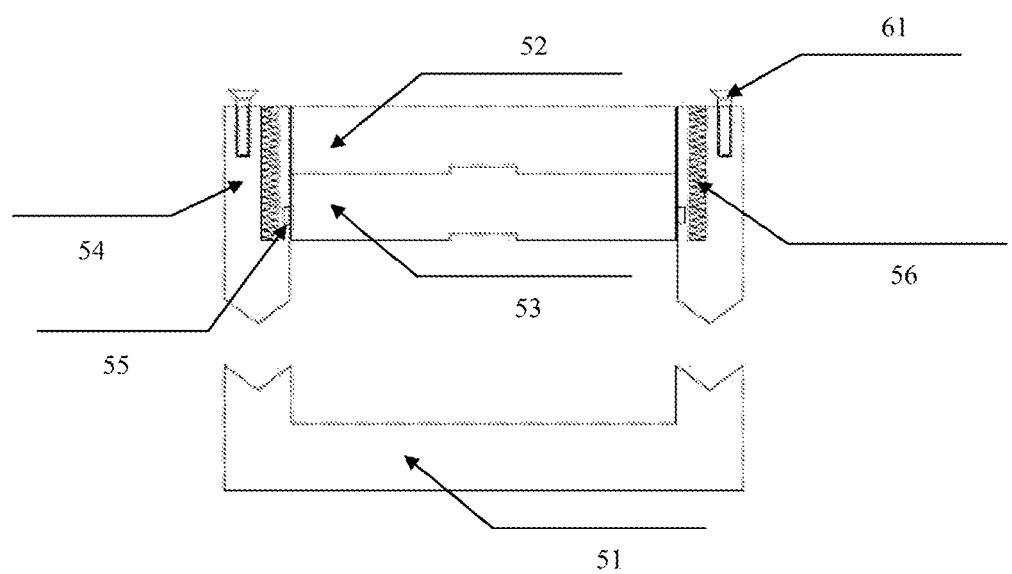
FIG. 8 is a side view of FIG. 7.
Figure 9:
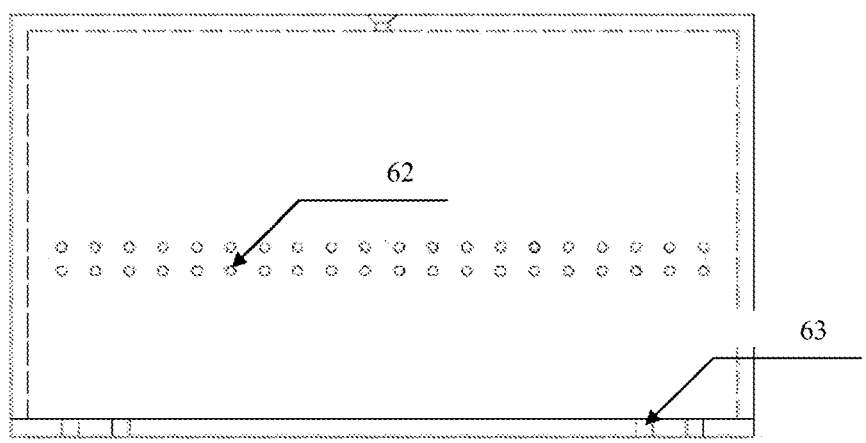
FIG. 9 is a schematic structural view of a protective housing of the present disclosure.
Figure 10:
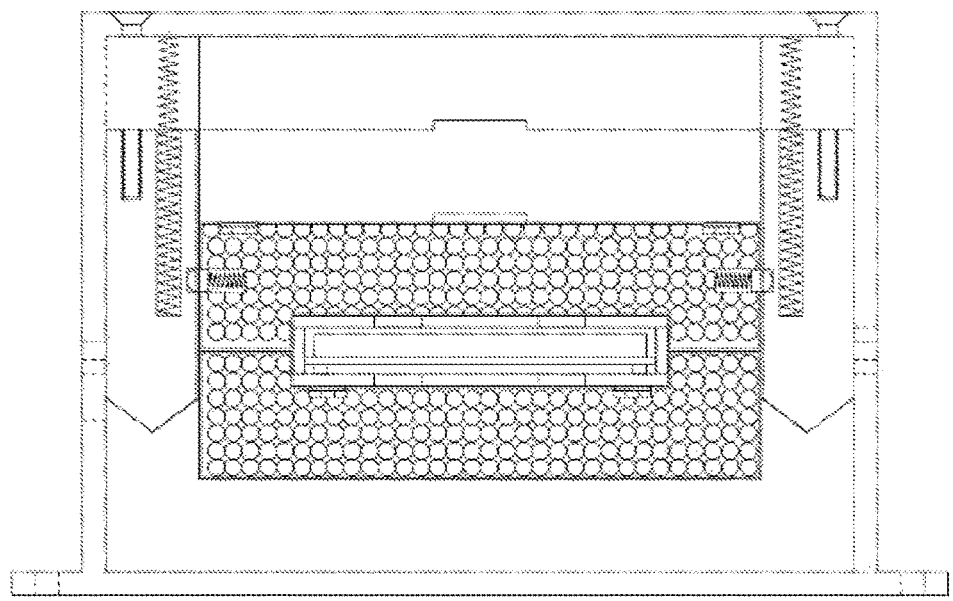
FIG. 10 is a schematic structural view after a movable block of a fire-proof box falls down and is locked in case of fire.
Figure 11:
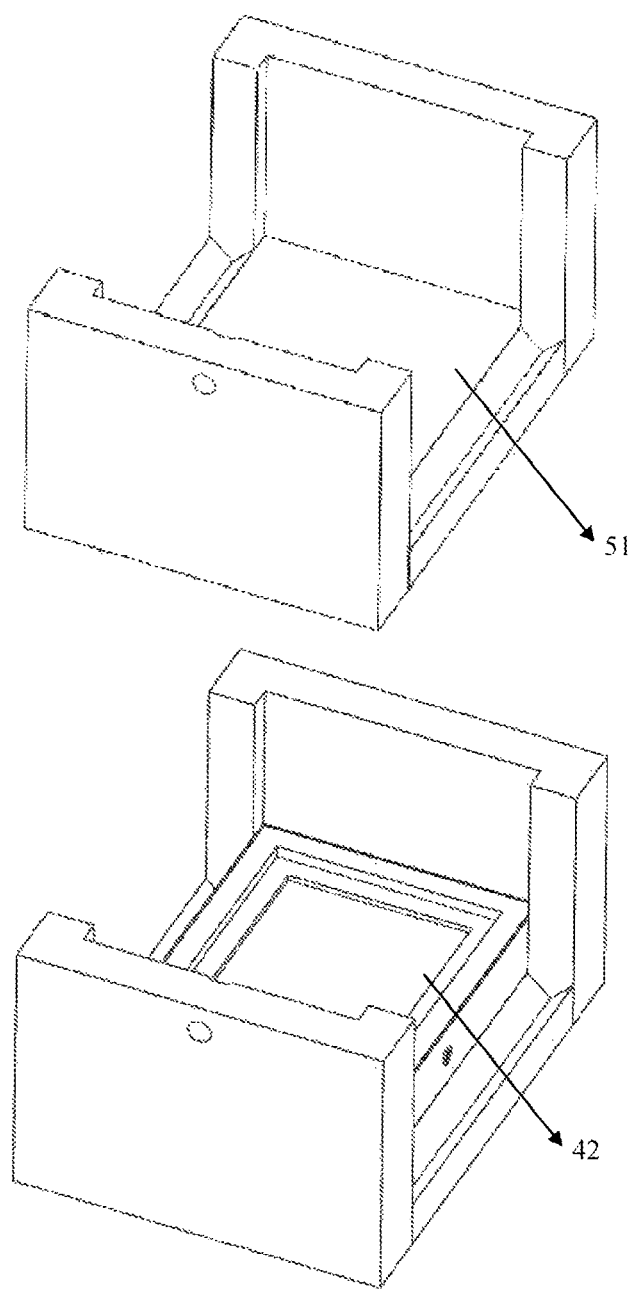
FIG. 11 is a first schematic view of a three-dimensional assembly process of the present disclosure.
Figure 12:
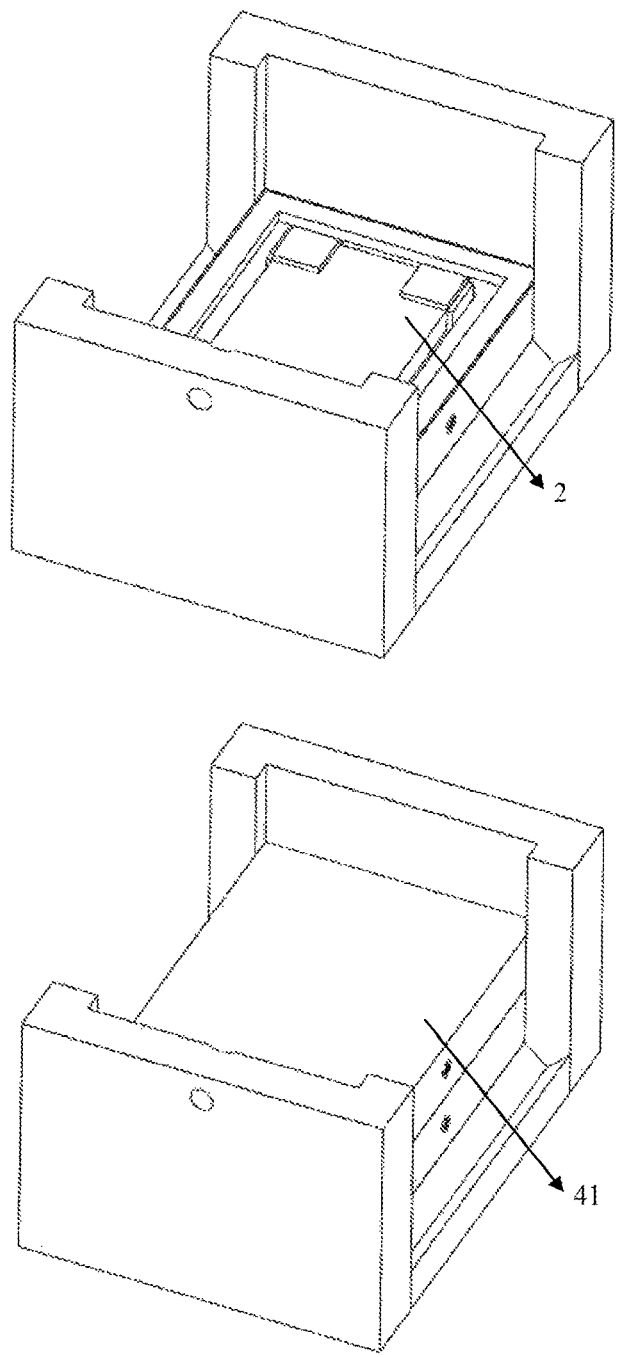
FIG. 12 is a second schematic view of a three-dimensional assembly process of the present disclosure.
Figure 13:
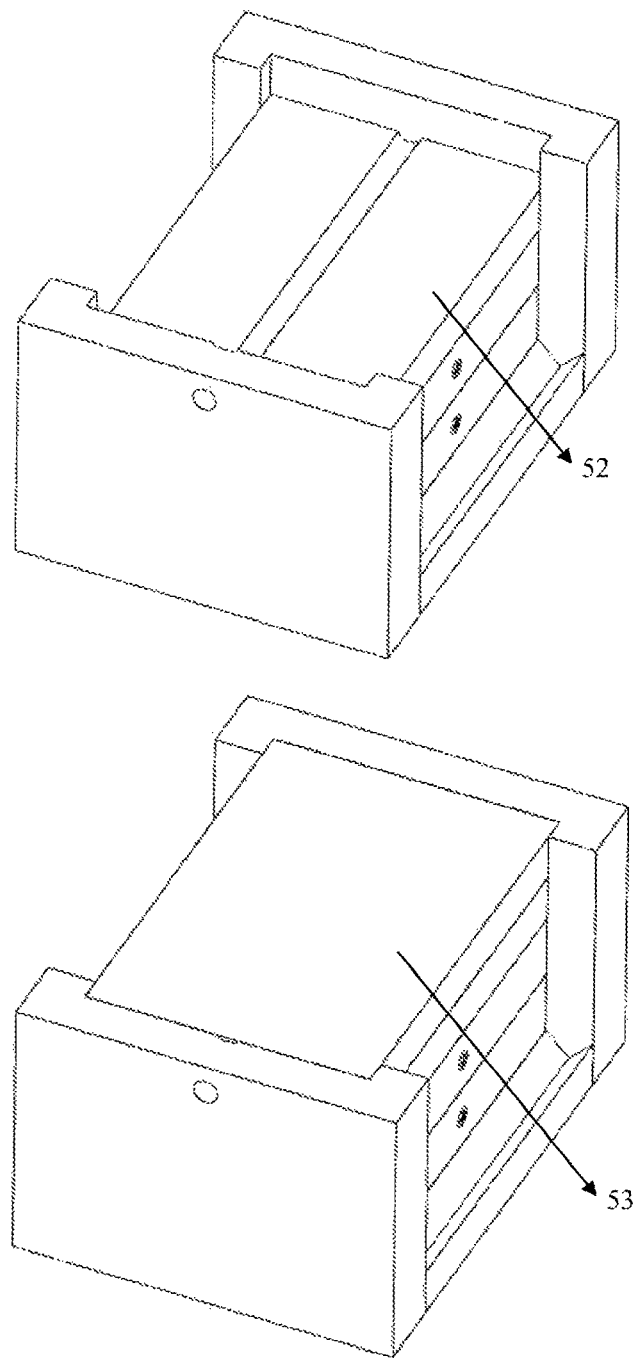
FIG. 13 is a third schematic view of a three-dimensional assembly process of the present disclosure.
Figure 14:
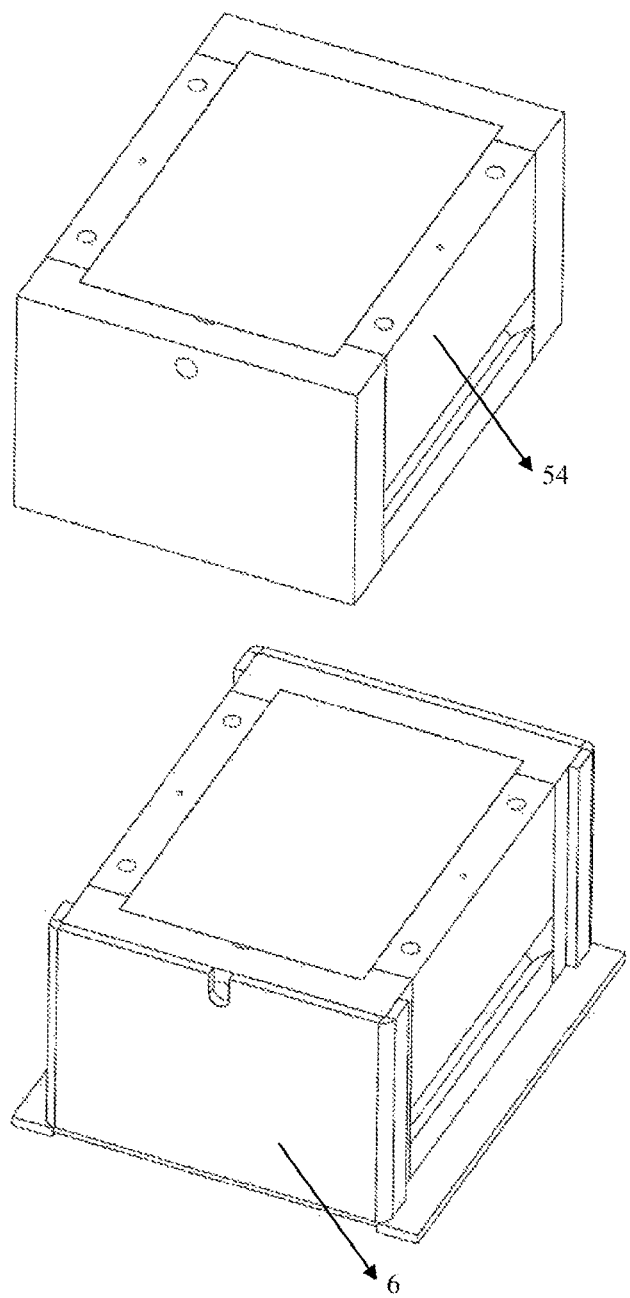
FIG. 14 is a fourth schematic view of a three-dimensional assembly process of the present disclosure.
Figure 15:
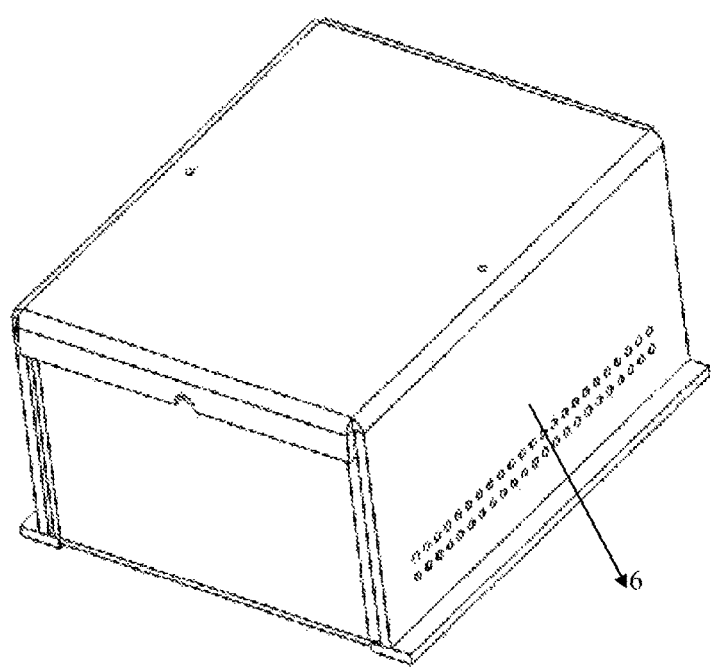
FIG. 15 is a fifth schematic view of a three-dimensional assembly process of the present disclosure.

Thirdly, a liquid with a boiling point of 90°-140° C., heat of vaporization of greater than 2000 kJ/kg and specific heat capacity of greater than 3.5 kJ/kg° C. is injected into the upper constant-temperature water shell 41 and the lower constant-temperature water shell 42. The liquid used in this embodiment is water. Heat is taken away by using thermal evaporation of the liquid, to cause time during which an ambient temperature of the water-proof shell in the mounting space is lower than a highest temperature (for example, 150° C.) that can be borne by the vehicle-carried data recording device to be not less than 40 minutes, so that the vehicle-carried data recording device will not be damaged due to high temperatures during combustion of a vehicle in case of fire. In order to ensure that the upper constant-temperature water shell and the lower constant-temperature water shell have water available for evaporation, this embodiment fills the upper constant-temperature water shell and the lower constant-temperature water shell with water-absorbing material balls, so that the water in the upper constant-temperature water shell and the lower constant-temperature water shell is adsorbed by the water-absorbing material balls. In this way, the water in the upper constant-temperature water shell and the lower constant-temperature water shell will not shake to impact the box body, and even if the upper constant-temperature water shell and the lower constant-temperature water shell are partially damaged or cracked, the upper constant-temperature water shell and the lower constant-temperature water shell still have water available for evaporation. The water generates water steam when reaching 100° C., the water steam escapes from the air outlet on the upper constant-temperature water shell and the lower constant-temperature water shell to take away heat, so as to keep the temperature in peripheries of the upper constant-temperature water shell and the lower constant-temperature water shell constant at 100° C. At this temperature, general vehicle-carried data recording devices can operate normally and data therein will not be damaged;

Fourthly, a constant-temperature water shell 4 composed of the upper constant-temperature water shell 41 and the lower constant-temperature water shell 42 is mounted in a fire-proof box 5 shown in FIG. 7 and FIG. 8, to prevent flame from directly burning the constant-temperature water shell in case of fire. In order to ensure heat dissipation during normal operation, a heat dissipation port, capable of closing automatically in case of fire, for outward heat dissipation of the constant-temperature water shell should be provided on one or more surfaces of the fire-proof box. The fire-proof box 5 consists of a box body 51 and box covers 52 and 53. The two box covers 52 and 53 have the same structure and the two box covers may also be combined into one. One or more surfaces in five surfaces composing the box body 51 are movable blocks 54 (two symmetrical movable blocks 54 are disposed in FIG. 7). A heat dissipation port is formed between the movable block 54 and the box body 51. The movable block 54 may be lifted in the protective housing 6 through a hot-melt plastic screw 61. When fire happens, the hot-melt plastic screw 61 is quickly burned out, the movable block 54 automatically falls down under the action of a spring 56 to close off the heat dissipation port, so as to prevent external heat from directly entering the constant-temperature water shell 4. Meanwhile, in order to prevent separation of the movable blocks 54 from the box bottom 51, a retaining pin hole 55 is provided on the movable block a matching retaining pin 43 is mounted on the constant-temperature water shell 4, and after the retaining pin 43 is inserted into the retaining hole 55, the movable block 54 is locked and positioned, as shown in FIG. 10.

Finally, the fire-proof box 5 is packed in a steel protective housing 6 with heat dissipation holes 62 to prevent the data recording device from being damaged when the vehicle is damaged by the action of an external force and to improve impact resistance of the data recording device, positions of the heat dissipation holes being opposite the heat dissipation port on the fire-proof box.

The whole assembly process is shown in FIG. 11 to FIG. 15.

Embodiment 2

Refer to FIG. 1 to FIG. 15.

A vehicle-carried data record protection device with high fire prevention performance and impact resistance includes:

a water-proof shell 2, where the water-proof shell 2 is configured to mount a vehicle-carried data recording device 1, to prevent the vehicle-carried data recording device 1 from being damaged due to entering of a liquid, and in order to reduce vibration during running of the vehicle and prevent influences of impact generated when the vehicle is damaged on the vehicle-carried data recording device 1, a shock pad 3 is mounted outside the water-proof shell 2;

a constant-temperature water shell 4, where the water-proof shell 2 is mounted in the constant-temperature water shell 4, and a liquid with a boiling point of 90°-140° C., heat of vaporization of greater than 2000 kJ/kg and specific heat capacity of greater than 3.5 kJ/kg° C. is injected into the constant-temperature water shell 4; where the constant-temperature water shell 4 is further provided with an air outlet 46 for escape of gas generated during evaporation of the liquid;

a fire-proof box 5, where the fire-proof box 5 is configured to pack the constant-temperature water shell 4 to prevent flame from directly burning the constant-temperature water shell 4; where the fire-proof box 5 consists of a box body 51 and a box cover 52, one or more of five surfaces composing the box body 51 are movable blocks 54, a heat dissipation port for heat dissipation of the constant-temperature water shell 4 is formed between the movable block 54 and a bottom surface of the box body 51, and the movable blocks 54 may automatically block the heat dissipation port in case of fire; and a protective housing 6, where the protective housing 6 is configured to mount the fire-proof box 5 and be fixedly connected to the vehicle and has a capability of resisting impact and transformation, heat dissipation holes 62 being provided at positions corresponding to that of the heat dissipation port.

The present disclosure makes improvements on the basis of the existing vehicle traveling data recorders, to separately place the circuit where data is stored into the protection device of the present disclosure. When spontaneous combustion or burnout is caused by a vehicle accident, the circuit for data storage is still intact, to allow related personnel to take out data information. The device has functions of high strength and good heat dissipation in normal operation, and in case of an accident, has fire resistance, high temperature resistance, good bearing capability, strong heat shock resistance and impact resistance.

During specific implementation, fire-proof protection consists of four material parts: water, an aluminum alloy, a nano-based insulation board, and an ordinary steel plate.
Material Property:
Property of the Aluminum Alloy:

The aluminum alloy has low density but high strength, which is close to or superior to high-quality steel, and has excellent electrical conductivity, thermal conductivity and corrosion resistance. A thermal conductivity coefficient of the aluminum alloy at a room temperature is: W/(m·K)=238 W/(m·K), where "W" denotes the thermal power unit, "m" represents the length unit (m), and "K" denotes the unit of absolute temperature. The greater the value is, the better the thermal-conducting property is. It can rapidly and effectively dissipate heat of internal circuit components, to prevent built-in circuit components from being damaged due to a too high temperature. Therefore, the water-proof shell 2 may be made of an aluminum alloy or made of metal with good thermal conductivity.
Property of the Nano-Based Insulation Board:

The nano-based insulation board is a high-performance high-temperature insulation board manufactured according to the micro-nano insulation principle and color aluminum silicon oxide vapor technologies by using high temperature fiber reinforcement. It is an A-class non-combustible material with high strength, has excellent insulating performance and good fire resistance, can significantly reduce the heat insulation thickness, has thermal conductivity coefficient even lower than that of the still air at room temperature, and is very suitable for backing insulation and application occasions where design of the thinnest insulation is required; its thermal conductivity coefficient is W/(m·K), =0.034 (800° C.).

The nano-based insulation board has a rigid plate, strong bearing capability, heat shock resistance, good high temperature stability and good resilience and is not easy to damage due to trampling. Therefore, the fire-proof box 5 in the embodiment of the present disclosure is prepared by using a nano-based insulation board.
Property of the Ordinary Steel Plate:

The ordinary steel plate has a pure and dense surface layer, good surface quality, high strength, high toughness, strong impact resistance, long service life and other good comprehensive performance. Therefore, the protective housing of the present disclosure is preferably prepared by using a steel plate.
Property of the Water:

When the water is heated, the volume increases and the density decreases.

Property of the water in this application is: a moderate boiling point, great specific heat capacity, an easily available material, non-corrosive and pollution-free. At one atmosphere pressure, 100° C. is the boiling point of water, and above 100° C., the water is gas (gaseous water). Therefore, the embodiment of the present disclosure preferably uses water as a constant-temperature liquid, and an anti-freezing solution may be used when it is necessary to improve anti-freezing performance in consideration of the northern climate.

Figure 1:
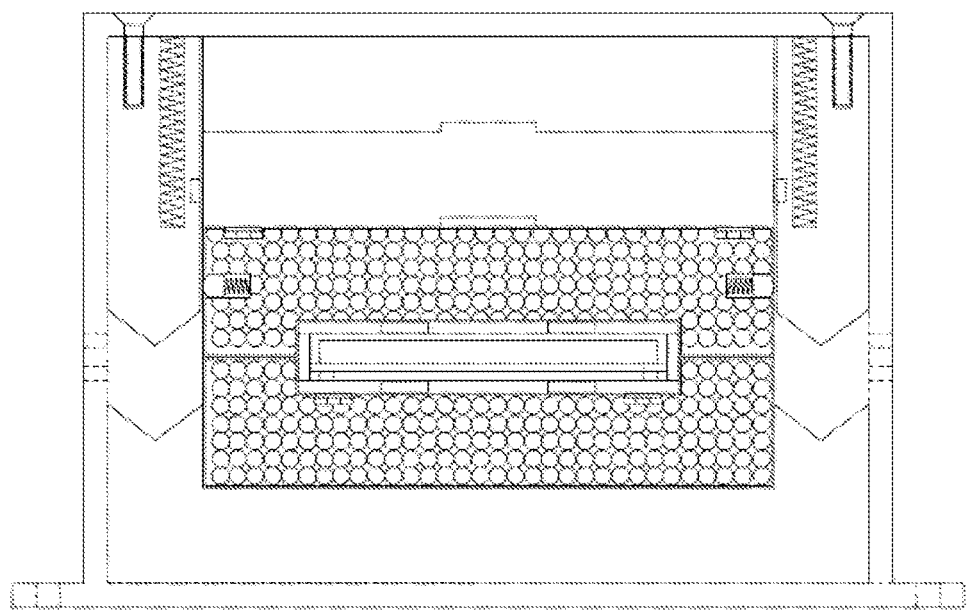
FIG. 1 is a schematic structural view of the present disclosure.
Figure 2:
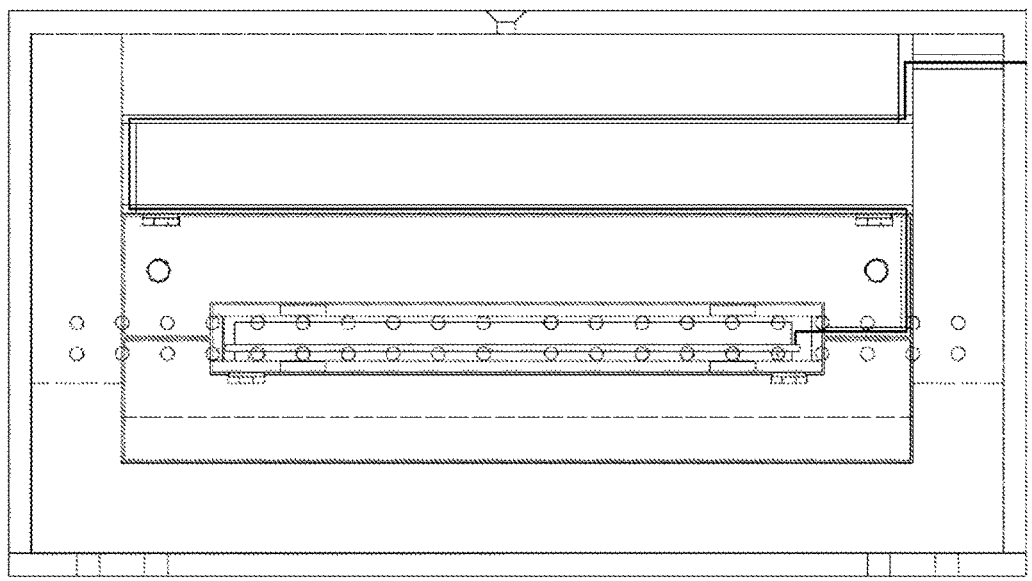
FIG. 2 is a schematic left structural view of FIG. 1.

Refer to FIG. 1 and FIG. 2.

The vehicle-carried data record protection device of the present disclosure has the following main components: a vehicle-carried data recording device 1, a water-proof shell 2, a shock pad 3, a constant-temperature water shell 4, a fire-proof box 5 and a steel protective housing 6. The vehicle-carried data recording device 1 is placed in the water-proof shell 2 and is led out from the water-proof shell 2 via a device connecting cable 11. The shock pads 3 are pasted to six directions of the housing of the water-proof shell 2. An outer surface of the water-proof shell 2 is protected by the constant-temperature water shell 4. The constant-temperature water shell 4 is composed of an upper constant-temperature water shell 41 and a lower constant-temperature water shell 42, and fillers in the upper and lower constant-temperature water shells are water-absorbing material balls 44 and water (or other liquids that can satisfy the preceding parameter requirements), respectively. A water injection port is sealed with a liquid-sealing paste 45. Two side surfaces thereof are provided with fire-proof heat-insulating movable block retaining pins 43, configured to coordinate with the left and right fire-proof heat-insulating movable blocks 54 in the fire-proof box 5, after being heated, to go down to be fixed with fire-proof heat-insulating movable block retaining pin holes 55. The fire-proof box 5 consists of four major parts, namely, a U-shaped fire-proof heat-insulating box body 51, a first fire-proof heat-insulating box cover 52, a second fire-proof heat-insulating box cover 53 and left and right fire-proof heat-insulating movable blocks 54. The first fire-proof heat-insulating box cover 52 and the second fire-proof heat-insulating box cover 53 may be two separate blocks or may be combined into one. A function of thermal protection is achieved through cooperation of left and right hot-melt plastic screws 61 and left and right compression springs 56 on the surface of the steel protective housing 6. The steel protective housing 6 is an outermost protective housing of this device. The housing is provided with convection heat dissipation holes 61 and a device fixing hole 62. The constant-temperature water shell 4 and the fire-proof box 5 are fixed through engagement of projections on the upper constant-temperature water shell 41 and the lower constant-temperature water shell 42 with recesses on the U-shaped box body 51 and the fire-proof box cover 53 of the fire-proof box, to prevent lateral movement.

The material of the water-proof shell 2 is an aluminum alloy, the vehicle-carried data recording device or circuit 1 needing protection may be placed therein and is led out through the device connecting cable 11, and then waterproof treatment is performed, as shown in FIG. 3 and FIG. 4.

The shock pad 3 has a thickness of 2.5 mm and is pasted to six directions of the housing of the water-proof shell 2. Four pads are pasted to each of upper and lower surfaces, two pads are pasted to each of front, back, left and right surfaces, and the total number is sixteen, which can have a good shock absorption effect during normal travelling of the vehicle, as shown in FIG. 4.

The constant-temperature water shell 4 is made of an aluminum alloy, has a thickness of 20 mm, and consists of two parts, namely, an upper constant-temperature water shell 41 and a lower constant-temperature water shell 42. Middle portions of the upper constant-temperature water shell 41 and the lower constant-temperature water shell 42 are hollowed and each of front surfaces thereof is provided with a water injection hole. The hollowed portions are filled with water-absorbing material balls 44, an appropriate amount of water is then injected therein, and the holes are sealed with liquid-sealing pastes 45 to prevent water from flowing out. Two sides of the upper constant-temperature water shell 41 are provided with fire-proof heat-insulating movable block retaining pins 43, configured to coordinate with the left and right fire-proof heat-insulating movable blocks 54 in the fire-proof box 5, after being heated, to go down to a limit position to be fixed with fire-proof heat-insulating movable block retaining pin holes 55, to prevent reverse movement of the left and right fire-proof heat-insulating movable blocks 54 after reversal of the device due to turnover of the vehicle in case of an accident which affects the heat-insulating effect, as shown in FIG. 5, FIG. 6, FIG. 7 and FIG. 8.

The water-absorbing material balls 44 are configured to adsorb a large amount of water in the constant-temperature water shell 4, to prevent the water in the constant-temperature water shell 4 from flowing out from the water injection holes in large quantity after the liquid-sealing pastes 45 are washed away by the steam once spontaneous combustion happens to the vehicle due to rollover or overturning in case of an accident, so as to play a role of locking the water.

The fire-proof box 5 is made of a nano-based insulation board, has a thickness of 20 mm and consists of four major parts: a U-shaped fire-proof heat-insulating box body 51, fire-proof heat-insulating box covers 52 and 53 and left and right fire-proof heat-insulating movable blocks 54. At room temperature, the left and right fire-proof heat-insulating movable blocks 54 and the steel protective housing 6 are connected together through left and right hot-melt plastic screws 61 to be in a suspension state shown in FIG. 1, for heat dissipation of the vehicle-carried data recording device or circuit 1 inside the water-proof housing 2. When being heated, the two screws lose the function of fixing at the time when the temperature is high enough to melt the left and right hot melt plastic screws 61. The left and right fire-proof heat-insulating movable blocks 54 are pushed to go down by means of the force of the left and right compression springs 56 in the left and right fire-proof heat-insulating movable blocks 54. When the movable blocks 54 reach limit positions, the fire-proof heat-insulating movable block retaining pin holes 55 fit with and are fixed to the fire-proof heat-insulating movable block retaining pins 43, to be in a state shown in FIG. 10.

The steel protective housing 6 is made of an ordinary steel plate and has a thickness of 5 mm. An upper cover thereof is provided with hole sites for the left and right hot-melt plastic screws 61. A side surface thereof is provided with convection heat dissipation holes 62, for heat dissipation of the constant-temperature water shell 4, the water-proof shell 2 and the vehicle-carried data recording device or circuit 1 under protection during normal operation. Four device fixing holes 63 on the base plate are hole sites for fixing the whole protective device to the vehicle. The left and right steel plates are inserted along inner walls of the base plate (FIG. 15) after the fire-proof box is placed. Such the structure plays a role of supporting to strengthen the force in a case where an external force is applied to the steel plate box.

Calculation of thermal conducting and fire resistance time of the present disclosure:

Assume that fire-proof objects to be protected are a standard 2.5 inch solid state drive and a drive shell, and computing units are described as follows:

mm=millimeter, cm=centimeter, m=meter, g=gram, kg=kilogram, W=watt, J=joule, °C.=Celsius degree, K=kelvin, s=second; the dimension of the water-proof shell 2 is 10 mm×75 mm×130 mm (H×W×L); the thickness of the shock pads 3 in six directions is 2.5 mm in each direction; the dimension of the constant-temperature water shell 4 is 55 mm×120 mm×175 mm (H×W×L); an internal protection space of the constant-temperature water shell 4 is 15 mm×80 mm×135 mm (H×W×L).

The thickness of the external nano-based insulation boards in six directions is 2 mm; the external dimension of the fire-proof box 5 is 115 mm×160 mm×215 mm; and the outermost is a steel protective housing 6 formed by 5-mm protective steel plates in six directions.

On this basis, it is calculated that:

the external volume of the constant-temperature water shell Vw=1155 cm$^3$; and the protection volume of the constant-temperature water shell Vn=162 cm$^3$.

In consideration of the wall thickness of the housing of the constant-temperature water shell, expansion of the volume when water is frozen as well as changes in the volume in case of expansion with hot and contraction with cold and air compression changes of the internal reserved space, including the volume occupied by the water-absorbing material, on the assumption that the effective volume rate is 60%, its internal effective water filling volume is Vs=(1155−162) *60%=595 cm$^3$; 595 g of water can be filled and for ease of calculation, water is 600 g=0.6 kg.

When the whole device is in a fire environment, the heating area of the device is Sw, the effective thermal-conducting area is Sr, the thermal-conducting thickness is Hr, the temperature of the flame is 1100° C., the vaporization point of water is 100° C., a difference between inside and outside temperatures is Tr, and the thermal conductivity coefficient of the nano-based insulation board is Kr=0.05 W/m·K (1000° C.);

$$Sw=(9.5*16+9.5*21.5+16*21.5)*2=1400.5 \text{ m}^2=0.14 \text{ m}^2$$

$$Sr=(5.5*12+5.5*17.5+12*17.5)*2=744.5 \text{ cm}^2=0.075 \text{ m}^2$$

$$Hr=2 \text{ cm}=0.02 \text{ m}$$

$$Tr=1100-100=1000° \text{ C.}$$

Accordingly, the thermal conducting power Pr is:

$$Pr=Kr*Sr*Tr/Hr=(0.05*0.075*1000)/0.02=187.5 \text{ W.}$$

The specific heat capacity of the water is 4.2 kJ/kg° C., and at 100° C., the heat of vaporization is 2260 kJ/kg (100° C.).

Assume that the temperature of the protective water shell is 50° C. before the fire happens to the device, the heat to be absorbed when the water temperature in the protective water shell rises to the boiling point of 100° C. is Wx, and the time required is Tx:

$$Wx=600*4.2*(100-50)=126000 \text{ J; and}$$

$$Tx=126000 \text{ J}/187.5 \text{ W}=672 \text{ s.}$$

Assume that the protective water shell is continuously heated after the water temperature rises to the boiling point until 50% of the water is vaporized, the heat absorbed is Wq, and the time required is Tq:

$$Wq=(600*50\%)*2260=678000 \text{ J;}$$

$$Tq=678000 \text{ J}/187.5 \text{ W}=3616 \text{ s; and}$$

the total time Tz=Tx+Tq=672+3616=4288 s=1 hour and 11 minutes.

The fire time is generally between 20 minutes and 40 minutes according to fire time statistics of multiple spontaneous combustion or fire after accidents of motor buses and passenger cars. Therefore, the device can effectively protect the internal circuit part, so that the temperature thereof does not exceed 100° C. during the fire, and stored data, video, audio and other data will not be lost.

If the storage circuit consumes little power, for example, use of an SD card for storage, a TF card for storage or a USB flash disk, the circuit itself can withstand a certain temperature rise (about 10° C.), the movable blocks can be cancelled, to form a completely closed structure, in this case, the internal circuit dissipates heat through an external housing, and in this case:

the effective heat-dissipation area Sr=0.075 m$^2$;

the heat-dissipation thickness Hr=2 cm=0.02 m;

the heat-dissipation temperature difference Tr=10° C.;

the thermal conductivity coefficient of the nano-based insulation board Kr=0.022 W/m·K (50° C.);

further, the effective heat-dissipation power is:

$$Ps=Kr*Sr*Tr/Hr=(0.022*0.075*10)/0.02=0.825 \text{ W.}$$

It can be known from the calculation that, if the power consumption of the internal circuit is less than 0.8 W, the movable blocks can be cancelled to form a completely closed structure when the internal circuit can withstand a difference between inside and outside temperatures of 10° C.

The working principle of the present disclosure is as follows:

1. The vehicle-carried data recording device or circuit 1 under protection will certainly produce a certain amount of heat during normal operation, and the heat can be dissipated through super thermal conductivity of the water-proof shell 2 and the constant-temperature water shell 4. Meanwhile, the left and right fire-proof heat-insulating movable blocks 54 are fixed onto the steel protective housing 6 through the left and right hot-melt plastic screws 61, a gap of 20 mm is reserved between each of the left and right fire-proof heat-insulating movable blocks 54 and the U-shaped fire-proof box body (that is, the heat-insulating bottom shell) 51. By using the gaps and the convection heat dissipation holes 62 on the steel protective housing 6, the constant-temperature water shell 4 directly communicates with the outside and dissipates heat through convection, so that the components of the vehicle-carried data recording device or circuit 1 under protection in the water-proof shell 2 are not damaged by high temperature.

2. The vehicle certainly produces mechanical vibration during travelling and transfers the mechanical vibration to the water-proof shell 2 and the vehicle-carried data recording device or circuit 1 under protection therein. The shock pads 3 cushion the vibration of the water-proof shell 2 and the vehicle-carried data recording device or circuit 1 under protection therein, thereby producing an effective shock absorption effect.

3. The vehicle produces a strong impact force in case of an accident, and integrity of the storage circuit board is guaranteed by using the property of the shock pads 3, the fire-proof heat-insulating layer (that is, the fire-proof box 5) and the steel protective housing 6, so that the circuit board is not damaged due to an external force.

4. When the vehicle burns due to an accident, the left and right hot-melt plastic screws 61 on the steel protective housing 6 are heated to melt when a certain temperature is reached (about 120° C.), thereby losing the function of fixing. The high-strength left and right compression springs 56 mounted onto the left and right fire-proof heat-insulating movable blocks 54 and the steel protective housing 6 push the left and right fire-proof heat-insulating movable blocks 54 to go downwards due to elastic potential energy, until the movable blocks 54 match the U-shaped fire-proof heat-insulating bottom shell (that is, the fire-proof box body 51). After the matching is in place, the fire-proof heat-insulating movable block retaining pin holes 55 fit with and are fixed to the fire-proof heat-insulating movable block retaining pins 43 on the side surfaces of the upper constant-temperature water shell 41 (as shown in FIG. 10). After the temperature continuously rises, if the compression springs 56 lose elasticity due to the high temperature, it will be ensured that reset displacement no longer happens to the left and right fire-proof heat-insulating movable blocks 54. In this way, the constant-temperature water shell 4, the water-proof shell 2 and the vehicle-carried data recording device or circuit 1 under protection therein are sealed inside. By using the property of the nano-based insulation board (the fire-proof box 5) plus the design of a "V"-shaped interface where the left and right fire-proof heat-insulating movable blocks 54 match the U-shaped fire-proof heat-insulating bottom shell 51 (FIG. 7), outside heat with a high temperature of greater than 1000° C. is kept out as much as possible out of direct contact with the constant-temperature water shell 4, so as to prolong the time during which the internal temperature rises to a destructive temperature.

5. When the combustion time of the flame is too long, the nano-based insulation board (the fire-proof box 5) will transfer a certain amount of heat thereto. The aluminum alloy quickly transfers the heat to the water inside the constant-temperature water shell 4 by using temperature characteristics of good thermal conductivity thereof. The water absorbs a great quantity of heat. When the temperature reaches 100° C., the water begins to boil and vaporize. The internal pressure increases, the liquid-sealing paste 45 on the surfaces of the water injection holes designed on the upper and lower box bodies of the aluminum-alloy constant-temperature water shell 4 will be washed away due to reduction of viscosity at great pressure and temperature of the internal water steam. The water steam is vaporized outwards. However, after the water boils, the water is continuously vaporized due to absorption of heat of vaporization, the water in the constant-temperature water shell 4 will be maintained at the boiling point (100° C.), the temperature thereof will no longer rise, the temperature of the protection space inside the constant-temperature water shell 4 will also be maintained at about 100° C. and will not rise before the water in the constant-temperature water shell 4 is completely vaporized, so as to protect the water-proof shell 2 in the protection space and the vehicle-carried data recording device or circuit 1 under protection.

6. Rollover, overturning and disintegration of the vehicle caused by an accident result in unforeseeable changes in the position and direction of the device and the liquid-sealing paste 45 and the water steam outlet 46 may be in any direction (which is downward in limiting cases). In this case, as fillers in the constant-temperature water shell 4 are high-strength water-absorbing material balls 44, most of liquid water will be locked, so that the liquid water will not flow out from the air outlet, but the vaporized steam may continuously overflow from the air outlet.

7. The device connecting cable 11 is made of metal lines and has good thermal conductivity and small thermal conductive interface; after being led out from the water-proof shell 2, the device connecting cable 11 wires along a reserved gap between the constant-temperature water shell 4 and the first fire-proof heat-insulating box cover 52, turns, then wires along a reserved gap between the first fire-proof heat-insulating box cover 52 and the second fire-proof heat-insulating box cover 53, and finally is led out from a hole of the steel protective housing 6; therefore, the device connecting cable 11 is prevented from conducting heat into the water-proof shell 2 or the vehicle-carried data recording device or circuit 1 under protection after burnout when the fire happens, causing a high temperature outside.

8. During the whole process of protecting the storage circuit by the protection device, it is calculated according to the above formulas that the total fire resistance time is up to 1 hour and 11 minutes. The fire time is generally between 20 minutes and 40 minutes according to fire time statistics of multiple spontaneous combustion or fire after accidents of motor buses and passenger cars. Therefore, the device can effectively protect the internal circuit part, so that the temperature thereof does not exceed 100° C. during the fire, and stored data, video, audio and other data will not be lost.

During the whole operation, the temperature of the protection device of the present disclosure has the following characteristics:

1. The nano-based insulation board (the fire-proof box) has high performance and high-temperature insulation effects, and use of the property of low thermal conductivity thereof ensures that heat is transferred thereto as less as possible when the external temperature is high.

2. After the heat is transferred thereto, the aluminum shell rapidly transfers the heat to water, and by using the great specific heat capacity of the water, the time during which the internal temperature rises to the boiling point of the water is extended as long as possible.

3. When the heat is continuously transferred thereto, the water absorbs the heat and begins to boil after the temperature rises to the boiling point. After boiling and vaporization, the temperature of the water no longer rises, and by using the property of great heat of vaporization of water, the water may absorb heat as much as possible before being fully vaporized, to prolong the time during which the internal space is maintained at the temperature of the boiling point of water.

4. The property of the water is that at one atmosphere pressure, 100° C. is the temperature of the boiling point of water. The temperature tolerance of components on the storage circuit during normal operation is 125° C. (automotive grade) or 85° C. (industrial grade), the storage temperature tolerance is 150° C. In this way, the internal temperature is controlled more effectively by using the great specific heat capacity and the high heat of vaporization of water, to prevent irreversible damage to the components due to a too high temperature. When the water boils, the internal part increases and the density decreases. To prevent explosion of the aluminum alloy caused by increase of the pressure, the water injection holes designed on the side surfaces of the upper and lower aluminum-alloy boxes may transform the water in the internal part become water steam to be ejected, thereby reducing the pressure inside the aluminum alloy.

The various embodiments described above can be combined to provide further embodiments. Aspects of the embodiments can be modified, if necessary to employ concepts of the various patents, applications and publications to provide yet further embodiments. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A method for improving fire prevention performance of a vehicle-carried data recording device, comprising:
mounting the vehicle-carried data recording device in a water-proof shell in a sealing manner;

mounting the water-proof shell, to which a shock pad is attached, in a mounting space enclosed by an upper constant-temperature water shell and a lower constant-temperature water shell;

injecting a liquid with a boiling point of 90°-140° C., a heat of vaporization of greater than 2000 kJ/kg and a specific heat capacity of greater than 3.5 kJ/kg° C. into the upper constant-temperature water shell and the lower constant-temperature water shell;

mounting a constant-temperature water shell composed of the upper constant-temperature water shell and the lower constant-temperature water shell in a fire-proof box; providing a heat dissipation port, configured to close automatically in case of fire and to dissipate heat of the constant-temperature water shell to one or more surfaces of the fire-proof box; and packing the fire-proof box in a protective housing with heat dissipation holes to aid in preventing the data recording device from being damaged when the vehicle is damaged by the action of an external force, positions of the heat dissipation holes being opposite the heat dissipation port on the fire-proof box.

2. The method according to claim 1, wherein the liquid is water or an anti-freezing solution with water as a main component.

3. The method according to claim 1, wherein the fire-proof box includes of a box body and a box cover, the box body including five surfaces, one or more surfaces of the five surfaces of the box body are movable blocks, the heat dissipation port is formed between the movable block and a base of the box body, the movable block is lifted in the protective housing through a hot-melt plastic screw, when fire happens, the hot-melt plastic screw is configured to burn out and allow the movable block to fall down under the action of a spring to close off the heat dissipation port, so as to aid in preventing external heat from directly entering the constant-temperature water shell, a retaining pin hole is provided on the movable block, a matching retaining pin is mounted on the constant-temperature water shell, the retaining pin and retaining pin hole are configured such that after the retaining pin is inserted into the retaining hole, the movable block is locked and positioned to aid in preventing separation of the moveable block from the box bottom.

4. The method according to claim 1, wherein the upper constant-temperature water shell and the lower constant-temperature water shell are filled with liquid-absorbing material balls, and liquids in the upper constant-temperature water shell and the lower constant-temperature water shell are adsorbed in the liquid-absorbing material balls.

5. A vehicle-carried data record protection device with high fire prevention performance and impact resistance, comprising:

a water-proof shell, wherein the water-proof shell is configured to mount a vehicle-carried data recording device and aid in preventing the vehicle-carried data recording device from being damaged due to entering of a liquid, and a shock pad is mounted outside the water-proof shell to aid in reducing vibration during running of the vehicle and to aid in preventing influences of impact generated when the vehicle is damaged on the vehicle-carried data recording device;

a constant-temperature water shell, wherein the water-proof shell is mounted in the constant-temperature water shell, and a liquid with a boiling point of 90°-140° C., a heat of vaporization of greater than 2000 kJ/kg and a specific heat capacity of greater than 3.5 kJ/kg° C. is injected into the constant-temperature water shell; wherein the constant-temperature water shell is further provided with an air outlet for escape of gas generated during evaporation of the liquid;

a fire-proof box, wherein the fire-proof box is configured to pack the constant-temperature water shell to aid in preventing flame from directly burning the constant-temperature water shell; wherein the fire-proof box includes of a box body and a box cover, the box body including five surfaces, one or more of the five surfaces of the box body are movable blocks, a heat dissipation port for heat dissipation of the constant-temperature water shell is formed between the movable block and a bottom surface of the box body, and the movable block configured to automatically block the heat dissipation port during a fire; and a protective housing, wherein the protective housing is configured to mount the fire-proof box and be fixedly connected to the vehicle and includes heat dissipation holes at positions corresponding to that of the heat dissipation port.

6. The vehicle-carried data record protection device according to claim 5, wherein the constant-temperature water shell includes an upper constant-temperature water shell and a lower constant-temperature water shell and is located in a space enclosed by the upper constant-temperature water shell and the lower constant-temperature water shell; the constant-temperature water shell is filled with liquid-absorbing material balls that aids in preventing the liquid from flowing out of the air outlet; and a retaining pin configured to lock the fire-proof movable block is mounted on the upper constant-temperature water shell or the lower constant-temperature water shell.

7. The vehicle-carried data record protection device according to claim 5, wherein a liquid-sealing paste seals the air outlet and is configured to open unseal the air outlet under impact of steam generated by the liquid in the constant-temperature water shell.

8. The vehicle-carried data record protection device according to claim 6, wherein the movable block in the fire-proof box is lifted in the protective housing by a hot-melt plastic screw, a preventing anti-reset spring and a retaining pin hole for locking are further provided on the movable block, and the retaining pin hole matches the retaining pin mounted on the constant-temperature water shell.

9. The vehicle-carried data record protection device according to claim 5, wherein a lower end of the movable block is a wedge-like structure composed of two slopes and a matching recess structure is provided on the box body at a position opposite the wedge-like structure.

10. The method according to claim 1, further comprising:
taking away heat by using thermal evaporation of the liquid, to cause a time during which an ambient temperature of the water-proof shell in the mounting space is lower than a highest temperature that can be borne by a data storage circuit of the vehicle-carried data recording device to be not less than 40 minutes, so that the data storage circuit of the vehicle-carried data recording device will not be damaged due to high temperatures during combustion of a vehicle in case of fire.

11. The method according to claim 1, wherein the mounting of the constant-temperature water shell composed of the upper constant-temperature water shell and the lower constant-temperature water shell in the fire-proof box prevents flame from directly burning the constant-temperature water shell in case of fire, and ensures heat dissipation of a circuit with large power consumption during normal operation.

12. The method according to claim 3, further comprising:
preventing separation of the movable blocks from the box bottom.

13. The method according to claim 4, further comprising:
maintaining a constant temperature in the constant-temperature water shell during combustion of a vehicle in case of fire where the upper constant-temperature water shell and the lower constant-temperature water shell have cracks or damage and rollover or overturning of the vehicle causes an unpredictable orientation of the constant-temperature water shell.

\* \* \* \* \*